US012740441B2

(12) United States Patent
Lin et al.

(10) Patent No.: US 12,740,441 B2
(45) Date of Patent: Sep. 15, 2026

(54) SEMICONDUCTOR PACKAGE

(71) Applicant: inergy Technology Inc., Hsinchu County (TW)

(72) Inventors: Li-Zheng Lin, Hsinchu County (TW); Lan-Wei Wen, Hsinchu County (TW)

(73) Assignee: inergy Technology Inc., Hsinchu County (TW)

( * ) Notice: Subject to any disclaimer, the term of this patent is extended or adjusted under 35 U.S.C. 154(b) by 382 days.

(21) Appl. No.: 18/519,032

(22) Filed: Nov. 26, 2023

(65) Prior Publication Data

US 2025/0096083 A1 Mar. 20, 2025

(30) Foreign Application Priority Data

Sep. 20, 2023 (TW) ................................ 112135942

(51) Int. Cl.
*H10W 70/40* (2026.01)
*H10W 90/00* (2026.01)

(52) U.S. Cl.
CPC ....... *H10W 70/481* (2026.01); *H10W 70/461* (2026.01); *H10W 90/736* (2026.01)

(58) Field of Classification Search
CPC .................................................. H01W 70/481
See application file for complete search history.

(56) References Cited

U.S. PATENT DOCUMENTS 6,249,041 B1 * 6/2001 Kasem .................. H10W 72/30 257/E23.044
6,396,127 B1 * 5/2002 Munoz ................ H10W 70/465 257/691
2005/0127532 A1 * 6/2005 Luo ..................... H10W 70/429 257/E23.044
2006/0138532 A1 * 6/2006 Okamoto ............ H10W 70/481 257/E23.044
2007/0290336 A1 * 12/2007 Sun ..................... H10W 70/466 257/E23.044
2010/0109135 A1 * 5/2010 Jereza ................ H10W 70/429 257/676

(Continued)

FOREIGN PATENT DOCUMENTS

CN 101720504 A 6/2010
TW 201133724 A 10/2011

(Continued)

*Primary Examiner* — William A Harriston
(74) *Attorney, Agent, or Firm* — CKC & Partners Co., LLC

(57) ABSTRACT

This disclosure provides a semiconductor package including a chip, a drain lead frame assembly, a source lead frame assembly, and an insulation layer. The chip includes an opposite drain surface and source surface. The drain lead frame assembly includes a drain contact plate, a drain connecting section, and drain leads integrally formed into one piece. The drain contact plate is physically connected to the drain surface. An area of the drain contact plate is larger than that of the drain surface. The source lead frame assembly includes a source contact plate, a source connecting section, and source leads integrally formed into one piece. The source contact plate is physically connected to the source surface. An area of the source contact plate is smaller than that of the source surface. The insulation layer encapsulates the chip and surrounds the drain contact plate and the source contact plate.

19 Claims, 8 Drawing Sheets

(56) References Cited

U.S. PATENT DOCUMENTS

| | | | | |
|---|---|---|---|---|
| 2011/0227207 | A1* | 9/2011 | Yilmaz | H10W 70/421<br>257/676 |
| 2014/0054758 | A1* | 2/2014 | Yilmaz | H10W 70/421<br>257/669 |
| 2021/0305166 | A1* | 9/2021 | Moxey | H10W 20/497 |

FOREIGN PATENT DOCUMENTS

| | | | |
|---|---|---|---|
| TW | 202129866 | A | 8/2021 |
| TW | 202247398 | A | 12/2022 |

* cited by examiner

10
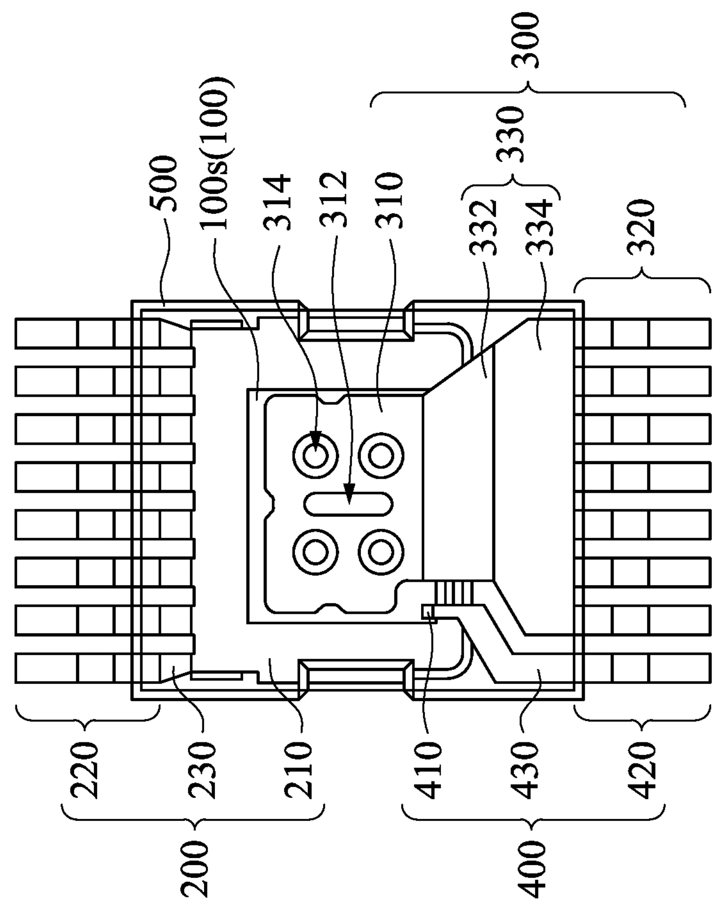
Fig. 1C
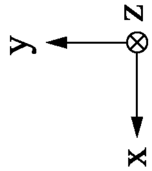

SEMICONDUCTOR PACKAGE

CROSS-REFERENCE TO RELATED APPLICATION

This application claims priority to Taiwan Application Serial Number 112135942, filed Sep. 20, 2023, which is herein incorporated by reference in its entirety.

BACKGROUND

Field of Invention

The present disclosure relates to the semiconductor package. More particularly, the present disclosure relates to the semiconductor package including leads.

Description of Related Art

The semiconductor industry continues to improve the integration density of various electronic components by continual reductions in minimum feature size, which allows more components to be integrated into a given area. However, the element impedance in devices can be easily increased as the semiconductor feature size reduces, leading to the degraded performance of the devices. In addition, the impacted elements with small sizes can lower the heat dissipation efficiency of the semiconductor device, which impacts the device performance and shortens the lifetime of the elements.

SUMMARY

According to some embodiments of the present disclosure, a semiconductor package includes a semiconductor chip, a drain lead frame assembly, a source lead frame assembly, and an insulating layer. The semiconductor chip includes a drain surface and a source surface opposite to each other. The drain lead frame assembly includes a drain contact plate, a drain connecting section, and a plurality of drain leads integrally formed into one piece. The drain connecting section connects the drain contact plate to the drain leads. The drain contact plate is physically connected to drain surface. An area of the drain contact plate is larger than that of the drain surface. The source lead frame assembly includes a source contact plate, a source connecting section, and a plurality of source leads integrally formed into one piece. The source connecting section connects the source contact plate to the source lead. The source contact plate is physically connected to the source surface. An area of the source contact plate is smaller than an area of the source surface. The insulating layer encapsulates the semiconductor chip and surrounds the drain contact plate and the source contact plate.

According to some embodiments of the present disclosure, a semiconductor package includes a semiconductor chip, a drain lead frame assembly, a source lead frame assembly, and an insulating layer. The semiconductor chip includes a drain surface and a source surface opposite to each other. The drain lead frame assembly is physically connected to the drain surface. The drain lead frame assembly includes a drain contact plate, a drain connecting section, and a plurality of drain leads integrally formed into one piece. An area of the drain contact plate is larger than an area of the drain surface. The source lead frame assembly is physically connected to the source surface. The source lead frame assembly includes a source contact plate, a source connecting section, and a plurality of source leads integrally formed into one piece. An area of the source contact plate is smaller than an area of the source surface. The insulating layer encapsulates the semiconductor chip and surrounds the drain contact plate and the source contact plate. A first surface of the insulating layer exposes the drain contact plate, and a second surface of the insulating layer opposite to the first surface exposes the source contact plate.

According to the embodiments of the present disclosure, the semiconductor package includes the drain lead frame assembly including the components integrally formed into one piece and the source lead frame assembly including the components integrally formed into one piece to reduce the internal impedance and improve the performance of the semiconductor package. The drain contact plate of the drain lead frame assembly has the area larger than that of the semiconductor chip, so that the exposed drain contact plate increases the heat dissipation efficiency of the semiconductor package. The source contact plate of the source lead frame assembly has the area smaller than that of the semiconductor chip, so that the exposed source contact plate not only improves the heat dissipation efficiency of the semiconductor package but also reduces the abnormality or failure of the semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C illustrates a bottom view of the semiconductor package in FIG. 1A to FIG. 1B.

DETAILED DESCRIPTION

Figures 1A, 1B:
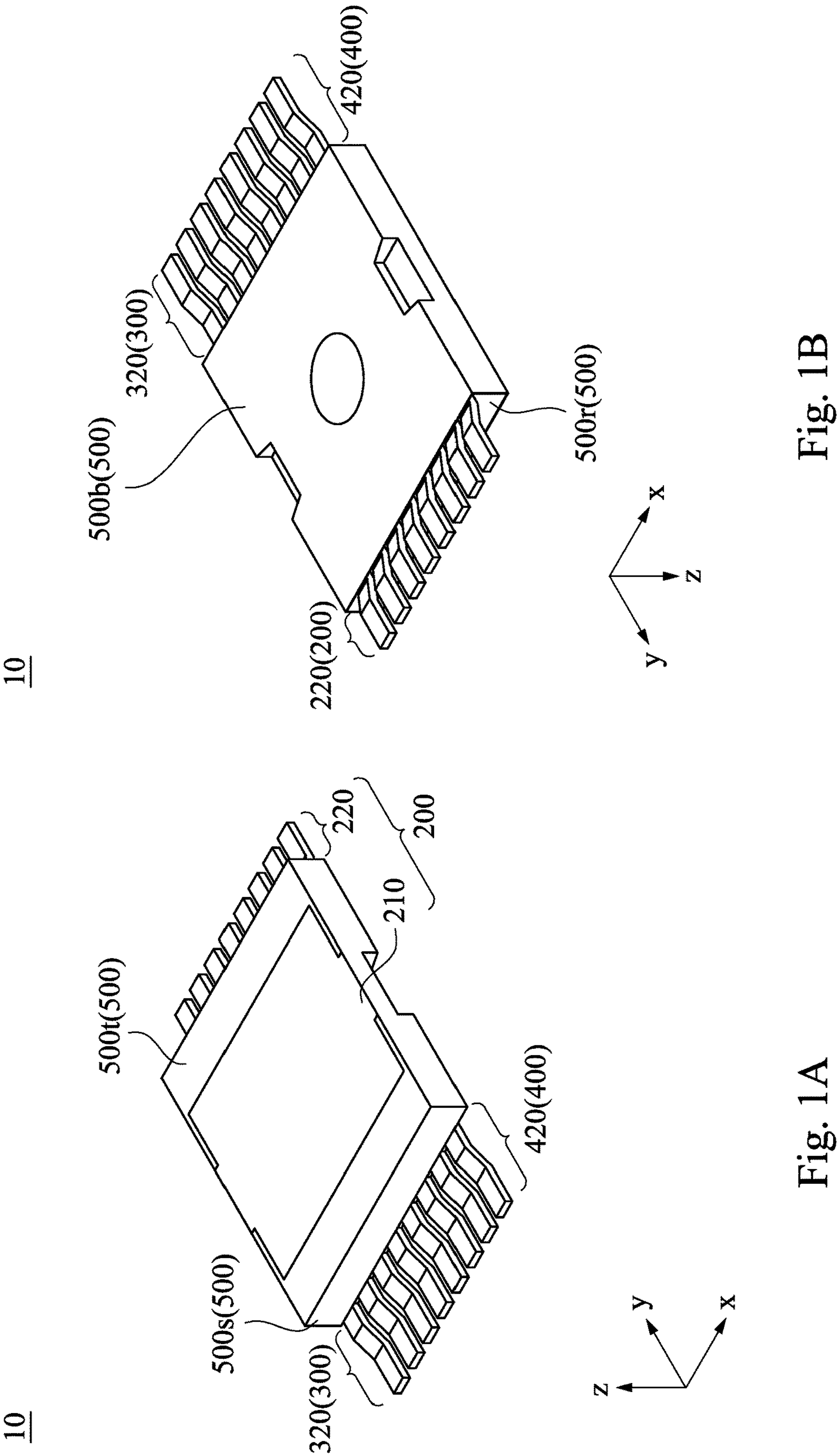
FIG. 1A to FIG. 1B illustrates a front side perspective view and a back side perspective view of a semiconductor package according to one embodiment of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor package including a drain lead frame assembly and a source lead frame assembly, in which each of the drain lead frame assembly and the source lead frame assembly has an integrally formed structure to reduce the internal impedance and improve the performance of the semiconductor package. The area of the drain contact plate of the drain lead frame assembly is larger than that of the semiconductor chip, and the area of the source contact plate of the source lead frame assembly is smaller than that of the semiconductor chip. Therefore, the exposed drain contact plate and source contact plate may increase the heat dissipation efficiency of the semiconductor package and reduce the abnormality or failure of the semiconductor package.

According to one embodiment of the present disclosure, FIG. 1A to FIG. 1B illustrates a front side perspective view and a back side perspective view of a semiconductor package 10, respectively. FIG. 1C illustrates a bottom view of the semiconductor package 10 in FIG. 1A to FIG. 1B, in which the insulating layer 500 in FIG. 1C is illustrated as a see-through element to clearly show the internal structure of the semiconductor package 10. FIG. 1A to FIG. 1C are simplified to clearly illustrate the semiconductor package 10, and the semiconductor packages including additional elements, such as adhesion layers between the illustrated elements, are in the scope of the present disclosure.

Referring to FIG. 1A to FIG. 1C, the semiconductor package 10 includes a semiconductor chip 100, a drain lead frame assembly 200, a source lead frame assembly 300, a gate lead frame assembly 400, and an insulating layer 500. The semiconductor chip 100 is electrically coupled to the drain lead frame assembly 200, the source lead frame assembly 300, and the gate lead frame assembly 400 to form a conductive path in the semiconductor package 10. The insulating layer 500 encapsulates the semiconductor chip 100 and the connecting points between the semiconductor chip 100 and multiple lead frame component assemblies to protect the conductive path in the semiconductor package 10.

Specifically, the drain lead frame assembly 200 includes a drain contact plate 210, drain leads 220, and a drain connecting section 230 that are integrally formed into one piece. The drain contact plate 210 is positioned on a drain side of the semiconductor chip 100 and is physically connected to a drain surface (for example, the drain surface 100*d* in FIG. 2B) of the semiconductor chip 100, thereby being electrically coupled to the semiconductor chip 100. The drain leads 220 extend out of the insulating layer 500 from a sidewall 500*r* of the insulating layer 500 to electrically couple the drain lead frame assembly 200 to other elements, such as a circuit board for providing a current to the semiconductor chip 100. The drain connecting section 230 physically connects the drain contact plate 210 to the drain leads 220 and is encapsulated by the insulating layer 500. In some embodiments which the drain lead frame assembly 200 includes a plurality of drain leads 220, the drain lead frame assembly 200 may include a plurality of drain connecting sections 230, while one end of each drain connecting section 230 is connected to one of the drain leads 220.

Figures 2A, 2B:
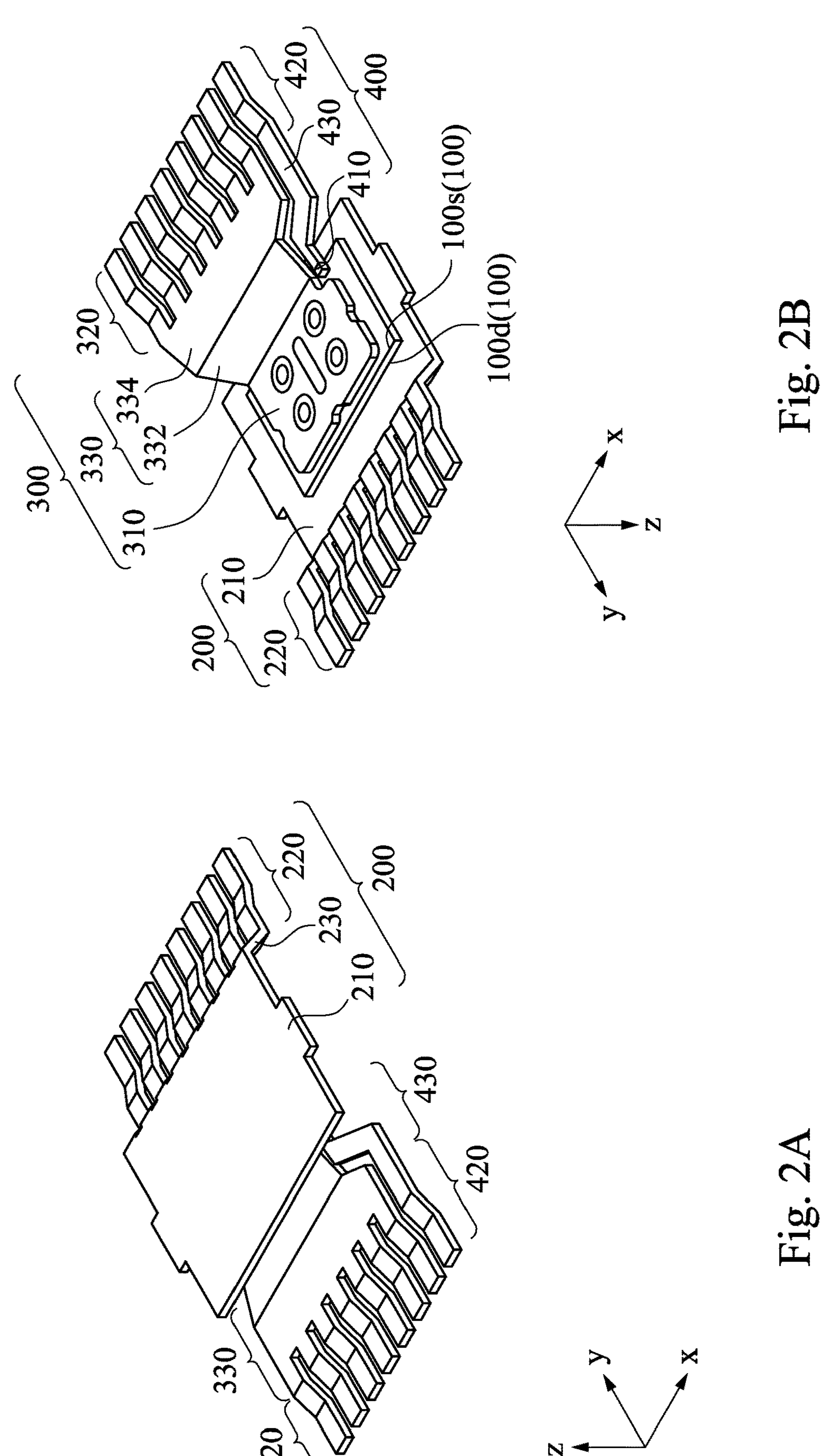
FIG. 2A to FIG. 2B illustrates a front side perspective view and a back side perspective view of the semiconductor package in FIG. 1A to FIG. 1B after removing the insulating layer.

The source lead frame assembly 300 includes a source contact plate 310, source leads 320, and a source connecting section 330 that are integrally formed into one piece. The source contact plate 310 is positioned on a source side of the semiconductor chip 100 and is physically connected to a source surface 100*s* of the semiconductor chip 100, thereby being electrically coupled to the semiconductor chip 100. The source surface 100*s* and the drain surface 100*d* are on opposite sides of the semiconductor chip 100 (as shown in FIG. 2B). The source leads 320 extend out of the insulating layer 500 from a sidewall 500*s* of the insulating layer 500 to electrically couple the source lead frame assembly 300 to other elements, where the sidewall 500*s* and the sidewall 500*r* are on opposite sides of the insulating layer 500. The source connecting section 330 physically connects the source contact plate 310 to the source leads 320 and is encapsulated by the insulating layer 500. In some embodiments which the source lead frame assembly 300 includes a plurality of source leads 320, the source lead frame assembly 300 may include a single source connecting section 330 with one end connected to all source leads 320.

The gate lead frame assembly 400 includes a gate contact plate 410, gate leads 420, and a gate connecting section 430 that are integrally formed into one piece. The gate contact plate 410 is positioned on a gate side of the semiconductor chip 100 and is physically connected to the semiconductor chip 100, thereby being electrically coupled to the semiconductor chip 100. In some embodiments which the gate and the source are on the same side of the semiconductor chip 100, the gate contact plate 410 may be physically connected to the gate region on the source surface 100*s*, while the gate contact plate 410 and the gate leads 420 may respectively be coplanar with the source contact plate 310 and the source leads 320 to balance the structure of the semiconductor package 10. The gate leads 420 extend out of the insulating layer 500 form the sidewall 500*s* of the insulating layer 500 to electrically couple the gate lead frame assembly 400 to other elements. The gate connecting section 430 physically connects the gate contact plate 410 to the gate leads 420 and is encapsulated by the insulating layer 500. In some embodiments, the gate lead frame assembly 400 may include a same number of the gate contact plates 410, the gate leads 420, and the gate connecting sections 430 that are one-to-one corresponded.

Since the drain lead frame assembly 200, the source lead frame assembly 300, and the gate lead frame assembly 400 have the integrally formed structures, the internal impedance of the lead frame assemblies may be reduced. For further illustration, FIG. 2A and FIG. 2B respectively illustrates a front side perspective view and a back side perspective view of the semiconductor package 10 in FIG. 1A and FIG. 1B after removing the insulating layer 500. As shown in FIG. 2A to FIG. 2B, the drain lead frame assembly 200 is a continuous conductive material layer, so that an interface or a seam is basically absent between the drain contact plate 210, the drain leads 220, and the drain connecting section 230. Similarly, the source lead frame assembly 300 and the gate lead frame assembly 400 are also continuous conductive material layers, which may reduce the impedance of the entirety of the semiconductor package 10 and improve the transmission efficiency of the semiconductor package 10.

In some embodiments, the formation of the lead frame assemblies may include performing a compression molding process to a conductive material (for example, a metal) to form a lead frame assembly that is integrally formed into one piece. Taking the source lead frame assembly 300 in FIG. 2B as an example, the source lead frame assembly 300 may be a copper sheet after the compression molding process, so that the source contact plate 310, the source leads 320, and the source connecting section 330 have a same material composition and a same thickness. Since the source lead frame assembly 300 is formed by a same copper sheet, the source lead frame assembly 300 may have low impedance and high reliability.

It should be noted that the drain lead frame assembly 200, the source lead frame assembly 300, and the gate lead frame assembly 400 illustrated in FIG. 2A to FIG. 2B include multiple regions divided by a number of lines, but these divided regions are used to represent the bending structure of the lead frame assembly rather than the various material layers having interfaces. For example, referring to FIG. 2B, the source connecting section 330 may include a first connecting subsection 332 connected to the source contact plate 310 and a second connecting subsection 334 connected to the source leads 320. The junction of the first connecting subsection 332 and the second connecting subsection 334 forms a bending structure, so that the source contact plate 310 and the source leads 320 have a height difference and are positioned on different planes.

Referring to FIG. 1A to FIG. 2B, the semiconductor chip 100, the drain contact plate 210, and the source contact plate 310 may have different sizes of the areas, thereby improving the heat dissipation efficiency of the semiconductor package 10 and reducing the abnormality or failure of the semiconductor package 10. Specifically, a lower surface of the drain contact plate 210 is attached to the drain surface 100*d* of the semiconductor chip 100, and an upper surface of the drain contact plate 210 is exposed by the top surface 500*t* of the insulating layer 500. As a result, the insulating layer 500 surrounds the drain contact plate 210. Comparatively, an upper surface of the source contact plate 310 is attached to the source surface 100*s*, but a bottom surface 500*b* of the insulating layer 500 covers a lower surface of the source contact plate 310 to provide the insulating layer 500 encapsulating the source contact plate 310.

As shown in FIG. 1C, an area of the drain contact plate 210 in the x-y plane is larger than an area of the drain surface 100*d* in the x-y plane. As the semiconductor chip 100 is operated, the drain contact plate 210 may absorb the heat from the drain surface 100*d* to conduct the thermal energy out of the semiconductor package 10, for example, to an external heat sink. Since the area of the drain contact plate 210 is larger than that of the drain surface 100*d*, the conduction efficiency from the drain surface 100*d* to the drain contact plate 210 may be increased, thereby increasing the heat dissipation efficiency of the semiconductor package 10. If the area of the drain contact plate 210 is smaller than that of the drain surface 100*d*, the thermal conductivity of the drain contact plate 210 may be too low to significantly improve the heat dissipation efficiency of the semiconductor package 10.

On the other hand, an area of the source contact plate 310 in the x-y plane is smaller than an area of the source surface 100*s* in the x-y plane. As a result, the source contact plate 310 may be entirely attached to the source surface 100*s*, leading to the semiconductor chip 100 separating the source contact plate 310 and the drain contact plate 210. In other words, the semiconductor chip 100 may reduce the risk of short circuit between the source contact plate 310 and the drain contact plate 210 when the area of the source contact plate 310 is smaller than that of the semiconductor chip 100, thereby reducing the failure of the semiconductor package 10.

In the embodiment illustrated in FIG. 1A to FIG. 1B, the insulating layer 500 exposes the drain contact plate 210 and encapsulates the source contact plate 310. In other embodiments, the insulating layer 500 may exposes the drain contact plate 210 and the source contact plate 310 together to increase the heat dissipation efficiency of the semiconductor device. Take as an example, FIG. 3A to FIG. 3B respectively illustrates a front side perspective view and a back side perspective view of a semiconductor package 20 according to one embodiment of the present disclosure. The semiconductor package 20 is similar to the semiconductor package 10 in FIG. 1A to FIG. 1B, but the semiconductor package 20 exposes the source contact plate 310.

Figures 3A, 3B:
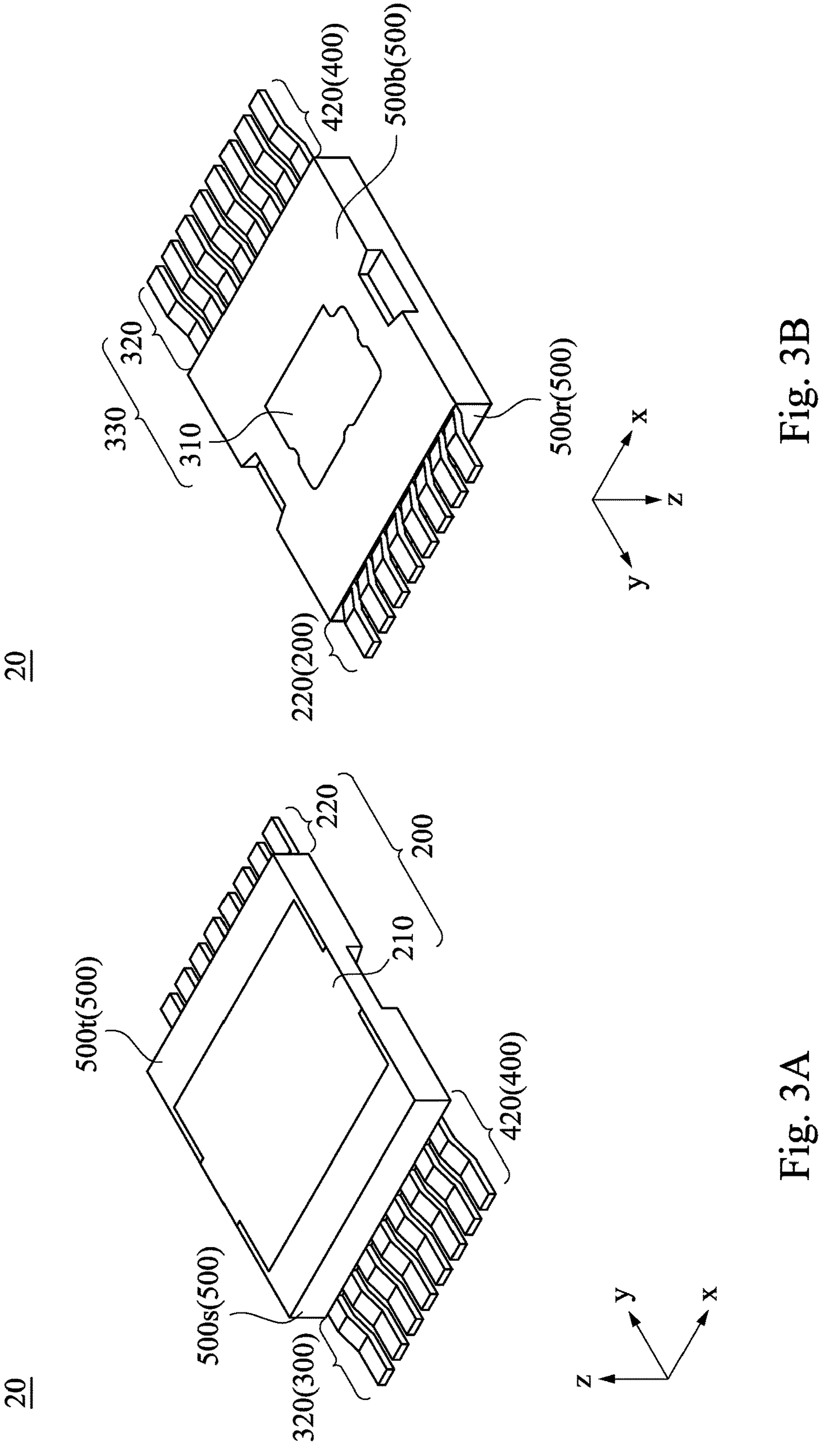
FIG. 3A to FIG. 3B illustrates a front side perspective view and a back side perspective view of a semiconductor package according to one embodiment of the present disclosure.

As shown in FIG. 3A to FIG. 3B, the top surface 500*t* of the insulating layer 500 exposes the upper surface of the drain contact plate 210, and the bottom surface 500*b* of the insulating layer 500 exposes the lower surface of the source contact plate 310. As the semiconductor chip, such as the semiconductor chip 100 in FIG. 1C, is operated, the heat generated by the semiconductor chip is mainly concentrated at the drain side of the semiconductor chip, which allows the drain contact plate 210 to absorb a majority of the heat from the semiconductor chip. Since the area of the drain contact plate 210 is larger than the surface area of the semiconductor chip, the drain contact plate 210 exposed by the top surface 500*t* may correspondingly be larger than or equal to the area of the semiconductor chip to improve the thermal conducting efficiency of the drain contact plate 210.

For the bottom surface 500*b* of the insulating layer 500, the bottom surface 500*b* may expose the source contact plate 310 but still cover the semiconductor chip to protect it. Since the area of the source contact plate 310 is smaller than the surface area of the semiconductor chip, the source contact plate 310 that can be exposed by the bottom surface 500*b* is correspondingly smaller than the surface area of the semiconductor chip. In some embodiments, the bottom surface 500*b* of the insulating layer 500 may expose the source contact plate 310 along the edges of the source contact plate 310 to completely expose the surface of the source contact plate 310.

As mentioned above, the exposed area of the drain contact plate 210 is larger than or equal to the area of the semiconductor chip, while the exposed area of the source contact plate 310 is smaller than the area of the semiconductor chip. In other words, the exposed area of the drain contact plate 210 exposed by the top surface 500*t* may be larger than the exposed area of the source contact plate 310 exposed by the bottom surface 500*b*. This combination of the exposed areas not only provides a stable stacked structure of the drain contact plate 210, the semiconductor chip, and the source contact plate 310, but also allows the drain contact plate 210 with the large exposed area to conduct the majority of the heat generated by the drain side of the chip and the source contact plate 310 with the small exposed area to simultaneously conduct the minority of the heat generated by the source side of the chip. Therefore, the heat dissipation efficiency of the semiconductor package 20 is improved.

In some embodiments, a surface area ratio of the source contact plate 310 over the semiconductor chip may be appropriate to increase the heat dissipation efficiency while the device performance of the semiconductor package 20 is remained stable. For example, the area of the source contact plate 310 may be 50% to 95% of the area of the source surface (for example, the source surface 100*s* in FIG. 1C). If the area of the source contact plate 310 is smaller than 50% of the area of the source surface, the thermal conductivity of the source contact plate 310 may be too low to significantly increase the heat dissipation efficiency of the semiconductor package 20. If the area of the source contact plate 310 is larger than 95% of the area of the source surface, the source contact plate 310 may extend beyond the semiconductor chip, which may easily result in the undesired conductive path between the source contact plate 310 and the drain contact plate 210.

In some embodiments, as the insulating layer 500 exposes the drain contact plate 210 or the source contact plate 310, the surface of the insulating layer 500 may be levelled with the surface of the contact plate to reduce the thickness of the semiconductor package. For example, as shown in FIG. 3A and FIG. 3B, the top surface 500*t* and the bottom surface 500*b* of the insulating layer 500 may be levelled with the upper surface of the drain contact plate 210 and the lower surface of the source contact plate 310, respectively, so that the thickness of the insulating layer 500 from the top surface 500*t* to the bottom surface 500*b* is approximate to the sum of the thicknesses of the drain contact plate 210, the semiconductor chip, and the source contact plate 310.

In some other embodiments, the drain contact plate 210 or the source contact plate 310 may be exposed by the opening extending into the insulating layer 500, so that the surface of the contact plate is closer to the semiconductor chip than the surface of the insulating layer 500 to protect the junctions. For example, an opening (not shown) may be formed from the bottom surface 500*b* toward the top surface 500*t*, where the lower surface of the source contact plate 310 is exposed by the bottom portion of the opening. As a result, the exposed surface of the source contact plate 310 is closer to the source surface of the semiconductor chip than the bottom surface 500*b* of the insulating layer 500. Therefore, the source contact plate 310 and the source surface may be protected by the surrounding insulating layer 500 to reduce the risk of damaging the semiconductor package damage.

In the embodiments illustrated in FIG. 1A to FIG. 1B and FIG. 3A to FIG. 3B, the drain leads 220 and the source leads 320 may collectively bend toward the bottom surface 500*b* of the insulating layer 500 after extending from the sidewall 500*r* and sidewall 500*s* of the insulating layer 500. Since the drain surface 100*d* of the semiconductor chip 100 faces the top surface 500*t* of the insulating layer 500, and the source surface 100*s* of the semiconductor chip 100 faces the bottom surface 500*b* of the insulating layer 500, the drain lead frame assembly 200 is positioned at the front side (or referred as the top portion) while the source lead frame assembly 300 is positioned at the back side (or referred as the bottom portion) for the semiconductor package 10 and the semiconductor package 20.

In some other embodiments, the semiconductor chip 100 and the lead frame assembly may be arranged in other manners or different lead directions, so that the drain lead frame assembly 200 is positioned at the back side of the semiconductor package while the source lead frame assembly 300 is positioned at the front side of the semiconductor package.

Figures 4A, 4B:
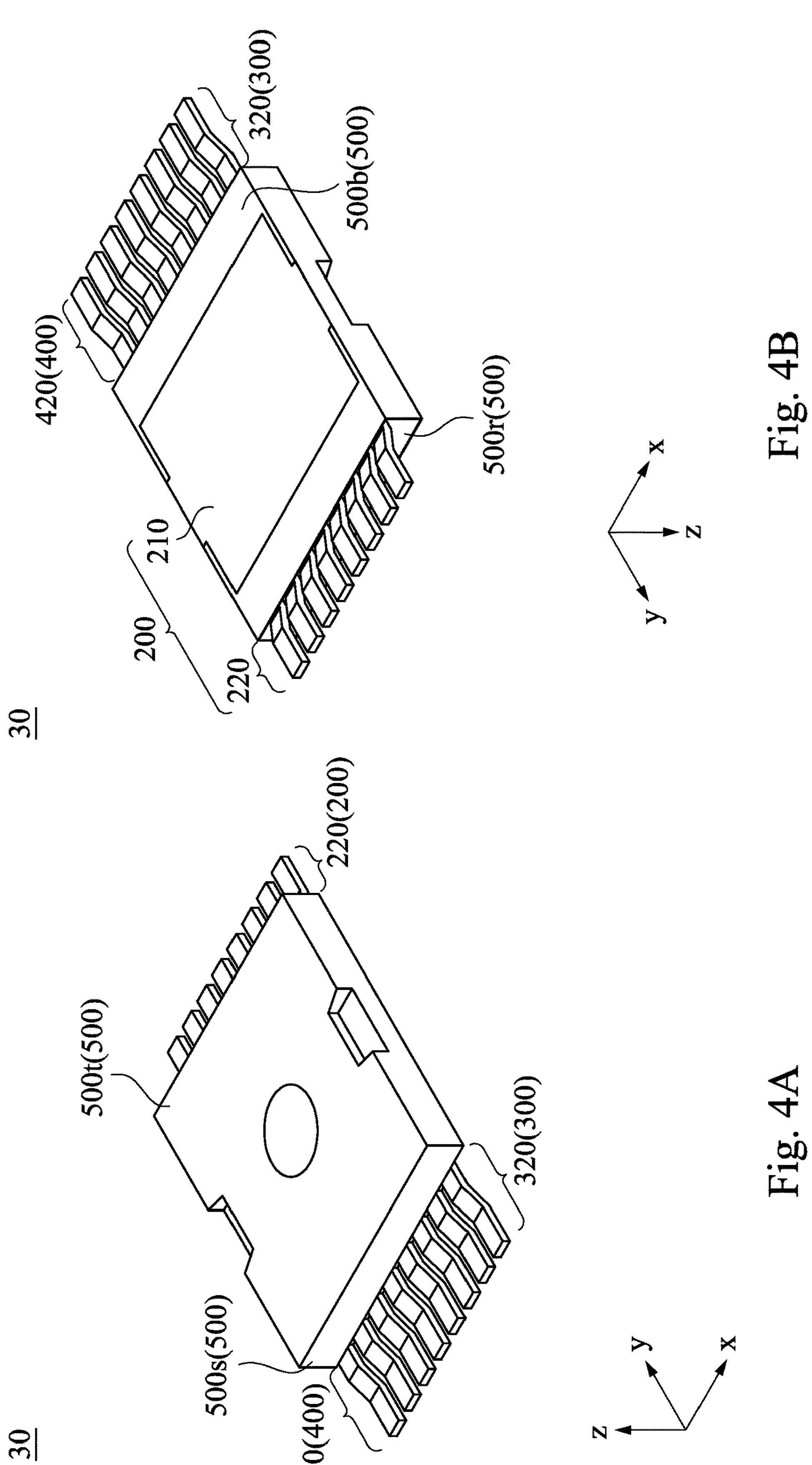
FIG. 4A to FIG. 4B illustrates a front side perspective view and a back side perspective view of a semiconductor package according to one embodiment of the present disclosure.
Figure 4C:
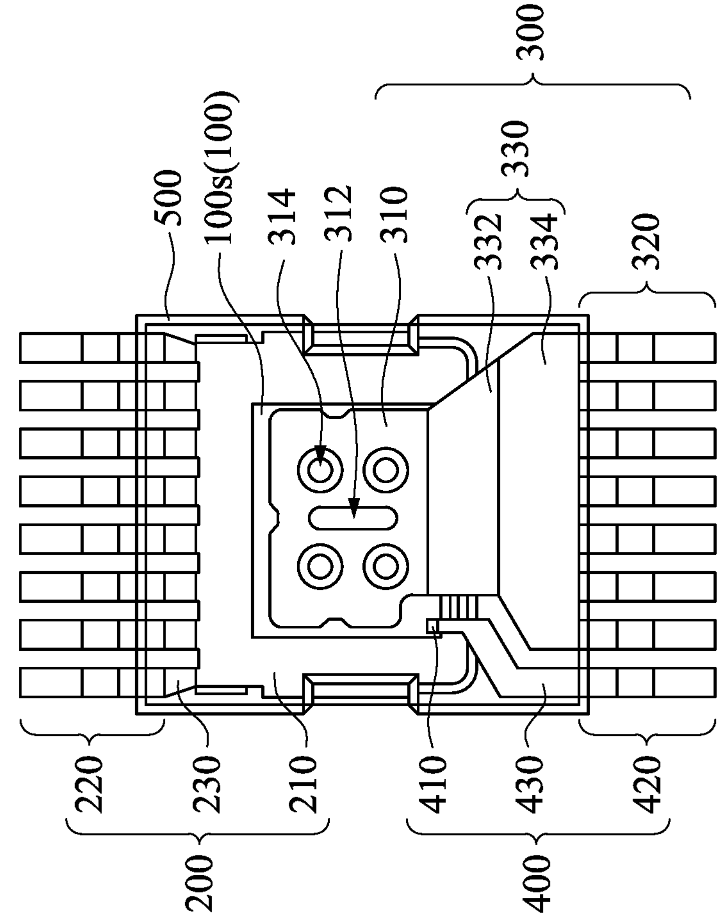
FIG. 4C illustrates a bottom view of the semiconductor package in FIG. 4A to FIG. 4B.

According to one embodiment of the present disclosure, FIG. 4A to FIG. 4B illustrates a front side perspective view and a back side perspective view of a semiconductor package 30, respectively. FIG. 4C illustrates a top view of the semiconductor package 30 in FIG. 4A to FIG. 4B, in which the insulating layer 500 in FIG. 4C is illustrated as a see-through element to clearly show the internal structure of the semiconductor package 30. The semiconductor package 30 is similar to the semiconductor package 10 in FIG. 1A to FIG. 1B, but the drain leads 220 and the source leads 320 of the semiconductor package 30 collectively bend toward the bottom surface 500*b* that exposes the drain contact plate 210. As a result, the drain lead frame assembly 200 is positioned at the back side of the semiconductor package 30, and the source lead frame assembly 300 is positioned at the front side of the semiconductor package 30.

Figures 5A, 5B:
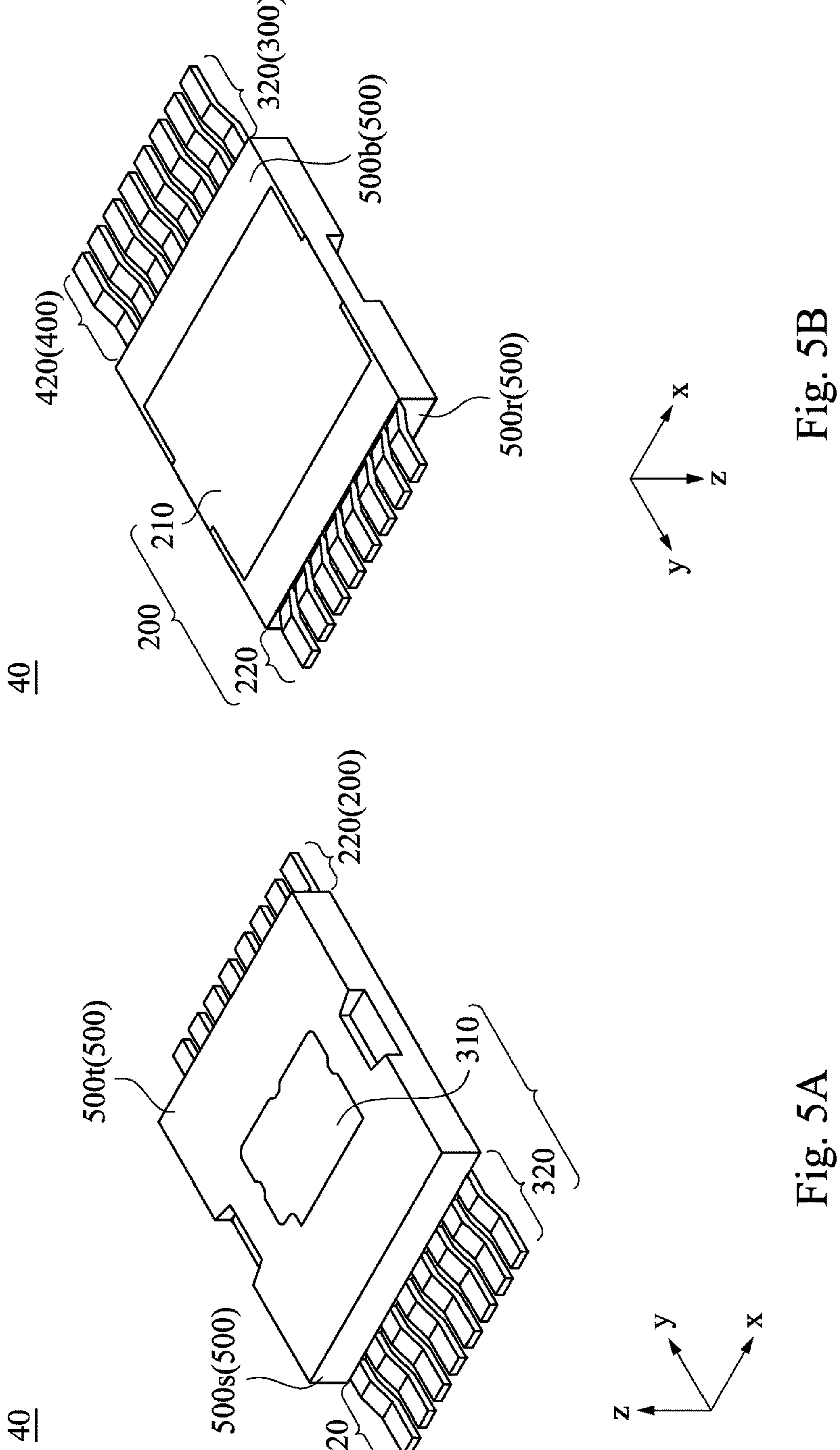
FIG. 5A to FIG. 5B illustrates a front side perspective view and a back side perspective view of a semiconductor package according to one embodiment of the present disclosure.

According to another embodiment of the present disclosure, FIG. 5A to FIG. 5B illustrates a front side perspective view and a back side perspective view of a semiconductor package 40, respectively. The semiconductor package 40 is similar to the semiconductor package 30 in FIG. 4A to FIG. 4B, but the front side of the semiconductor package 40 further exposes the source contact plate 310 to increase the heat dissipation efficiency of the semiconductor package 40. The details of the semiconductor package 40 exposing the source contact plate 310 may refer to the semiconductor package 20 illustrated in FIG. 3A to FIG. 3B.

Referring back to FIG. 1C, the source contact plate 310 in some embodiments may directly contact the source surface 100*s* to reduce the interface amount between layers in the semiconductor package 10. In some other embodiments, the source contact plate 310 may be attached to the source surface 100*s* by an additional material layer. Specifically, a solder layer (not shown) may be formed on the source surface 100*s*, and the source lead frame assembly 300 is positioned onto the solder layer to connect the source contact plate 310 to source surface 100*s* by the solder layer. After the solder layer is sandwiched by the source contact plate 310 and the source surface 100*s*, the solder layer may physically connect the source contact plate 310 to the source surface 100*s* to fix the source contact plate 310 on the semiconductor chip 100.

In the embodiments which the source contact plate 310 is connected to the source surface 100*s* by the additional material layer, the source contact plate 310 may include at least one opening exposing the source surface 100*s* to increase the bonding uniformity between the source contact plate 310 and the source surface 100*s*. As shown in FIG. 1C, the source contact plate 310 may include an opening 312 and openings 314 extending from the upper surface to the lower surface, which allows the opening 312 and the openings 314 to expose the source surface 100*s* of the semiconductor chip 100. During the bonding of the source contact plate 310 to the source surface 100*s* by the solder layer, the solder material may overflow into the opening 312 and the openings 314 due to the pressing of the source contact plate 310 to the source surface 100*s*. As a result, the opening 312 and the openings 314 may expose a portion of the solder layer. Since the opening 312 and the openings 314 accommodate the overflowed solder material, the thickness uniformity of the solder layer between the source contact plate 310 and the semiconductor chip 100 may be improved. In addition, accommodating the excessive solder material by the opening 312 and the openings 314 may reduce the risk of shifting between the source contact plate 310 and the semiconductor chip 100, which improves the alignment accuracy in the semiconductor package.

In some embodiments, the opening in the source contact plate 310 may occupy an appropriate ratio of the area to increase the bonding uniformity between the source contact plate 310 and the semiconductor chip 100 and the heat dissipation efficiency of the semiconductor package 10. For example, the opening 312 and the openings 314 may occupy 1% to 40% of a total area of the source contact plate 310, in which the total area of the source contact plate 310 is the sum of the conductive material area and the opening area. If the opening occupies smaller than 1% of the area of the source contact plate 310, the size of the opening may be too small to accommodate the overflowed solder material to increase the alignment accuracy between the source contact plate 310 and the semiconductor chip 100. If the opening occupies larger than 40% of the area of the source contact plate 310, the conductive material area of the source contact plate 310 may be too small to significantly increase the heat dissipation efficiency of the semiconductor package 10.

It should be noted that, in the embodiments which the area of the source contact plate 310 is 50% to 95% of the area of the source surface 100*s*, the area of the source contact plate 310 includes the sum of the conductive material area and the opening area of the source contact plate 310.

In the embodiment illustrated in FIG. 1C, the source contact plate 310 includes one long opening 312 in the center region and four circular openings 314 at the peripheral region, but it is not intended to limit the source contact plate of the present disclosure. In some other embodiments, the source contact plate 310 may include one or more openings with the same or different shapes and dimensions.

Figure 6B:
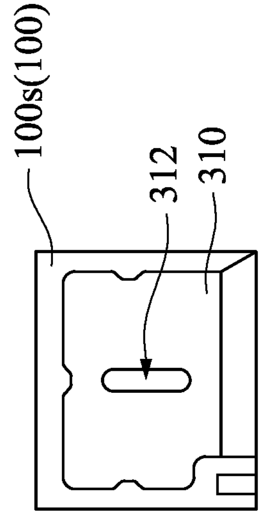
FIG. 6A to FIG. 6D illustrate top views of source contact plates according to some embodiments of the present disclosure.
Figure 6D:
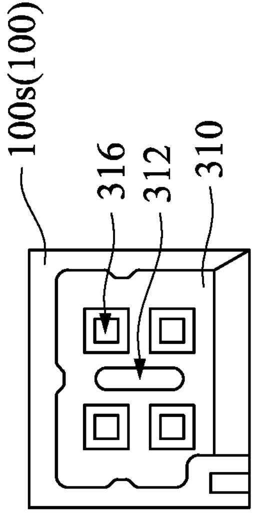
Figure 6A:
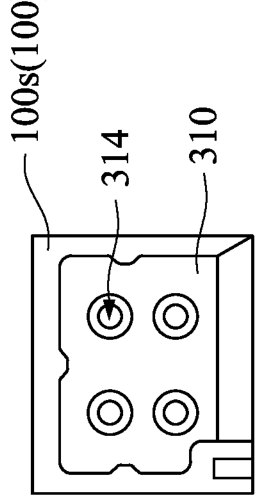
Figure 6C:
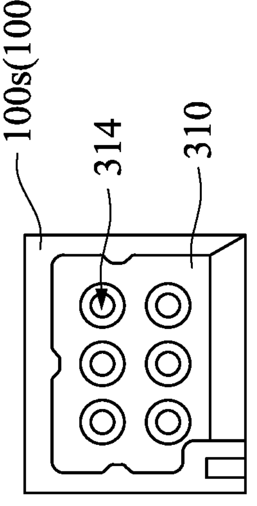

For example, FIG. 6A to FIG. 6D illustrate top views of the source contact plates 310 according to some embodiments of the present disclosure. The source contact plates 310 in FIG. 6A and FIG. 6B are similar to that of in FIG. 1C, but the source contact plate 310 in FIG. 6A has the four circular openings 314, the source contact plate 310 in FIG. 6B has the long opening 312. The source contact plate 310 in FIG. 6C includes six circular openings 314 arranged in a two-dimensional array, in which each of the circular openings 314 has the same dimension. The openings of the source contact plate 310 in FIG. 6D are arranged in a manner similar to that of in FIG. 1C, but the source contact plate 310 in FIG. 6D includes one long opening 312 and four square openings 316.

According to the above-mentioned embodiments, the semiconductor package includes the semiconductor chip, the lead frame assemblies, and the insulating layer. The lead frame assembly includes the contact plate, the leads, and the connecting section integrally formed into one piece, which reduces the impedance and increase the reliability of the semiconductor package. Since the drain contact plate and the source contact plate physically connected to the semiconductor chip has the area larger than that of the semiconductor chip and the area smaller than that of the semiconductor chip, respectively, the risk of abnormality (for example, short circuit) in the semiconductor package may be reduced. In addition, the drain contact plate and the source contact plate exposed by the insulating layer expose may increase the heat dissipation efficiency of the semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a semiconductor chip comprising a drain surface and a source surface opposite to each other;

a drain lead frame assembly comprising a drain contact plate, a drain connecting section, and a plurality of drain leads, wherein the drain contact plate, the drain connecting section, and the drain leads are integrally formed into one piece, the drain connecting section connects the drain contact plate to the drain leads, the drain contact plate is physically connected to the drain surface, an area of the drain contact plate is larger than an area of the drain surface;

a source lead frame assembly comprising a source contact plate, a source connecting section, and a plurality of source leads, wherein the source contact plate, the source connecting section, and the source leads are integrally formed into one piece, the source connecting section connects the source contact plate to the source leads, the source contact plate is physically connected to the source surface, an area of the source contact plate is smaller than an area of the source surface, wherein the source contact plate further comprises at least one opening exposing the source surface; and an insulating layer encapsulating the semiconductor chip and surrounding the drain contact plate and the source contact plate.

2. The semiconductor package of claim 1, wherein the area of the source contact plate is 50% to 95% of the area of the source surface.

3. The semiconductor package of claim 1, wherein a first surface of the source contact plate is attached to the source surface, and wherein a surface of the insulating layer exposes a second surface of the source contact plate, the second surface is opposite to the first surface.

4. The semiconductor package of claim 3, wherein the surface of the insulating layer is levelled with the second surface of the source contact plate.

5. The semiconductor package of claim 3, wherein the second surface of the source contact plate is closer to the source surface than the surface of the insulating layer.

6. The semiconductor package of claim 3, wherein the insulating layer encapsulates the source connecting section, and the insulating layer completely exposes the second surface along edges of the source contact plate.

7. The semiconductor package of claim 1, wherein a first surface of the drain contact plate is attached to the drain surface, and wherein a surface of the insulating layer exposes a second surface of the drain contact plate, the second surface is opposite to the first surface.

8. The semiconductor package of claim 1, wherein the source contact plate, the source connecting section, and the source leads have a same thickness.

9. The semiconductor package of claim 1, further comprising:

a solder layer physically connecting the source contact plate to the source surface, wherein the at least one opening exposes the solder layer.

10. The semiconductor package of claim 1, wherein the area of the source contact plate comprises a portion occupied by the at least one opening, and the area of the source contact plate is 50% to 95% of the area of the source surface.

11. The semiconductor package of claim 1, wherein the opening occupies 1% to 40% of the area of the source contact plate.

12. The semiconductor package of claim 1, wherein the source connecting section comprises a bending structure to position the source contact plate and the source leads on different planes.

13. The semiconductor package of claim 1, further comprising:

a gate lead frame assembly including a gate contact plate, a gate connecting section, and a gate lead, wherein the gate contact plate, the gate connecting section, and the gate lead are integrally formed into one piece, the gate connecting section connects the gate contact plate to the gate lead, the gate contact plate is physically connected to the source surface.

14. The semiconductor package of claim 13, wherein the gate contact plate is coplanar with the source contact plate, and wherein the gate lead is coplanar with the source leads.

15. The semiconductor package of claim 1, wherein the insulating layer encapsulates the drain connecting section and the source connecting section, and wherein the drain leads and the source leads extend out of the insulating layer from opposite sidewalls of the insulating layer.

16. A semiconductor package, comprising:

a semiconductor chip comprising a drain surface and a source surface opposite to each other;

a drain lead frame assembly being physically connected to the drain surface, wherein the drain lead frame assembly comprises a drain contact plate, a drain connecting section, and a plurality of drain leads integrally formed into one piece, an area of the drain contact plate is larger than an area of the drain surface;

a source lead frame assembly being physically connected to the source surface, wherein the source lead frame assembly comprises a source contact plate, a source connecting section, and a plurality of source leads integrally formed into one piece, an area of the source contact plate is smaller than an area of the source surface, wherein the source contact plate further comprises at least one opening exposing the source surface; and an insulating layer encapsulating the semiconductor chip and surrounding the drain contact plate and the source contact plate, wherein a first surface of the insulating layer exposes the drain contact plate, and a second surface of the insulating layer opposite to the first surface exposes the source contact plate.

17. The semiconductor package of claim 16, wherein an exposed area of the drain contact plate exposed by the first surface is larger than or equal to an exposed area of the source contact plate exposed by the second surface.

18. The semiconductor package of claim 16, wherein the drain leads and the source leads collectively bend toward one of the first surface or the second surface of the insulating layer.

19. The semiconductor package of claim 16, wherein the drain leads and the source leads collectively bend toward the first surface of the insulating layer.

* * * * *